United States Patent
Kuo et al.

(10) Patent No.: US 8,680,656 B1
(45) Date of Patent: Mar. 25, 2014

(54) LEADFRAME STRUCTURE FOR CONCENTRATED PHOTOVOLTAIC RECEIVER PACKAGE

(75) Inventors: Bob Shih Wei Kuo, Chandler, AZ (US); John Merrill Nickelsen, Jr., Gilbert, AZ (US); Timothy L. Olson, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 884 days.

(21) Appl. No.: 12/348,853

(22) Filed: Jan. 5, 2009

(51) Int. Cl.
*H01L 23/495* (2006.01)

(52) U.S. Cl.
USPC ............. 257/666; 257/13; 257/98; 257/99; 257/E33.056; 257/E33.065

(58) Field of Classification Search
USPC ...................... 257/13, 98–99, 666
See application file for complete search history.

(56) References Cited

U.S. PATENT DOCUMENTS

| | | | |
|---|---|---|---|
| 2,596,993 | A | 5/1952 | Gookin |
| 3,435,815 | A | 4/1969 | Forcier |
| 3,734,660 | A | 5/1973 | Davies et al. |
| 3,838,984 | A | 10/1974 | Crane et al. |
| 4,054,238 | A | 10/1977 | Lloyd et al. |
| 4,189,342 | A | 2/1980 | Kock |
| 4,221,925 | A | 9/1980 | Finley et al. |
| 4,258,381 | A | 3/1981 | Inaba |
| 4,289,922 | A | 9/1981 | Devlin |
| 4,301,464 | A | 11/1981 | Otsuki et al. |
| 4,332,537 | A | 6/1982 | Slepcevic |
| 4,417,266 | A | 11/1983 | Grabbe |
| 4,451,224 | A | 5/1984 | Harding |
| 4,530,152 | A | 7/1985 | Roche et al. |
| 4,541,003 | A | 9/1985 | Otsuka et al. |
| 4,646,710 | A | 3/1987 | Schmid et al. |
| 4,707,724 | A | 11/1987 | Suzuki et al. |

(Continued)

FOREIGN PATENT DOCUMENTS

| | | |
|---|---|---|
| DE | 19734794 A1 | 8/1997 |
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |

(Continued)

OTHER PUBLICATIONS

National Semiconductor Corporation, "Leadless Leadframe Package," Informational Pamphlet from webpage, 21 pages, Oct. 2002, www.national.com.
Vishay, "4 Milliohms in the So-8: Vishay Siliconix Sets New Record for Power MOSFET On-Resistance," Press Release from webpage, 3 pages, www.vishay.com/news/releases, Nov. 7, 2002.

(Continued)

*Primary Examiner* — Ahmed Sefer

(57) ABSTRACT

In accordance with the present invention, there is provided multiple embodiments of a concentrated photovoltaic receiver package or module. In each embodiment of the present invention, the module comprises a leadframe including a first section and a second section disposed in spaced relation to each other. Mounted to the first section of the leadframe is a receiver die. The receiver die is electrically connected to both the first and second sections of the leadframe. In one embodiment of the present invention, the receiver die is electrically connected to the second section of the leadframe by a plurality of conductive wires. In another embodiment of the present invention, the receiver die is electrically connected to the second section of the leadframe by a conductive bonding material. Portions of the leadframe may optionally be covered by a molded body which can be used to define an alignment feature for a light concentrating device such as a light guide or optical rod.

20 Claims, 10 Drawing Sheets

(56) References Cited

U.S. PATENT DOCUMENTS

| | | | | |
|---|---|---|---|---|
| 4,727,633 | A | 3/1988 | Herrick | |
| 4,737,839 | A | 4/1988 | Burt | |
| 4,756,080 | A | 7/1988 | Thorp, Jr. et al. | |
| 4,812,896 | A | 3/1989 | Rothgery et al. | |
| 4,862,245 | A | 8/1989 | Pashby et al. | |
| 4,862,246 | A | 8/1989 | Masuda et al. | |
| 4,907,067 | A | 3/1990 | Derryberry | |
| 4,920,074 | A | 4/1990 | Shimizu et al. | |
| 4,935,803 | A | 6/1990 | Kalfus et al. | |
| 4,942,454 | A | 7/1990 | Mori et al. | |
| 4,987,475 | A | 1/1991 | Sclesinger et al. | |
| 5,018,003 | A | 5/1991 | Yasunaga | |
| 5,029,386 | A | 7/1991 | Chao et al. | |
| 5,041,902 | A | 8/1991 | McShane | |
| 5,057,805 | A * | 10/1991 | Kadowaki | 333/247 |
| 5,057,900 | A | 10/1991 | Yamazaki | |
| 5,059,379 | A | 10/1991 | Tsutsumi et al. | |
| 5,065,223 | A | 11/1991 | Matsuki et al. | |
| 5,070,039 | A | 12/1991 | Johnson et al. | |
| 5,079,190 | A * | 1/1992 | Mihara | 438/26 |
| 5,087,961 | A | 2/1992 | Long et al. | |
| 5,091,341 | A | 2/1992 | Asada et al. | |
| 5,096,852 | A | 3/1992 | Hobson et al. | |
| 5,118,298 | A | 6/1992 | Murphy | |
| 5,122,860 | A | 6/1992 | Kikuchi et al. | |
| 5,134,773 | A | 8/1992 | LeMaire et al. | |
| 5,151,039 | A | 9/1992 | Murphy | |
| 5,157,475 | A | 10/1992 | Yamaguchi | |
| 5,157,480 | A | 10/1992 | McShane et al. | |
| 5,168,368 | A | 12/1992 | Gow, 3rd et al. | |
| 5,172,213 | A | 12/1992 | Zimmerman | |
| 5,172,214 | A | 12/1992 | Casto | |
| 5,175,060 | A | 12/1992 | Enomoto et al. | |
| 5,200,362 | A | 4/1993 | Lin et al. | |
| 5,200,809 | A | 4/1993 | Kwon | |
| 5,214,845 | A | 6/1993 | King et al. | |
| 5,216,278 | A | 6/1993 | Lin et al. | |
| 5,218,231 | A | 6/1993 | Kudo | |
| 5,221,642 | A | 6/1993 | Burns | |
| 5,250,841 | A | 10/1993 | Sloan et al. | |
| 5,252,853 | A | 10/1993 | Michii | |
| 5,258,094 | A | 11/1993 | Furui et al. | |
| 5,266,834 | A | 11/1993 | Nishi et al. | |
| 5,273,938 | A | 12/1993 | Lin et al. | |
| 5,277,972 | A | 1/1994 | Sakumoto et al. | |
| 5,278,446 | A | 1/1994 | Nagaraj et al. | |
| 5,279,029 | A | 1/1994 | Burns | |
| 5,281,849 | A | 1/1994 | Singh Deo et al. | |
| 5,285,352 | A | 2/1994 | Pastore et al. | |
| 5,294,897 | A | 3/1994 | Notani et al. | |
| 5,307,362 | A * | 4/1994 | Tanaka et al. | 372/50.1 |
| 5,327,008 | A | 7/1994 | Djennas et al. | |
| 5,332,864 | A | 7/1994 | Liang et al. | |
| 5,335,771 | A | 8/1994 | Murphy | |
| 5,336,931 | A | 8/1994 | Juskey et al. | |
| 5,343,076 | A | 8/1994 | Katayama et al. | |
| 5,358,905 | A | 10/1994 | Chiu | |
| 5,365,106 | A | 11/1994 | Watanabe | |
| 5,381,042 | A | 1/1995 | Lerner et al. | |
| 5,391,439 | A | 2/1995 | Tomita et al. | |
| 5,406,124 | A | 4/1995 | Morita et al. | |
| 5,410,180 | A | 4/1995 | Fujii et al. | |
| 5,414,299 | A | 5/1995 | Wang et al. | |
| 5,417,905 | A | 5/1995 | LeMaire et al. | |
| 5,424,576 | A | 6/1995 | Djennas et al. | |
| 5,428,248 | A | 6/1995 | Cha | |
| 5,435,057 | A | 7/1995 | Bindra et al. | |
| 5,444,301 | A | 8/1995 | Song et al. | |
| 5,452,511 | A | 9/1995 | Chang | |
| 5,454,905 | A | 10/1995 | Fogelson | |
| 5,467,032 | A | 11/1995 | Lee | |
| 5,474,958 | A | 12/1995 | Djennas et al. | |
| 5,484,274 | A | 1/1996 | Neu | |
| 5,493,151 | A | 2/1996 | Asada et al. | |
| 5,508,556 | A | 4/1996 | Lin | |
| 5,517,056 | A | 5/1996 | Bigler et al. | |
| 5,521,429 | A | 5/1996 | Aono et al. | |
| 5,528,076 | A | 6/1996 | Pavio | |
| 5,534,467 | A | 7/1996 | Rostoker | |
| 5,539,251 | A | 7/1996 | Iverson et al. | |
| 5,543,657 | A | 8/1996 | Diffenderfer et al. | |
| 5,544,412 | A | 8/1996 | Romero et al. | |
| 5,545,923 | A | 8/1996 | Barber | |
| 5,581,122 | A | 12/1996 | Chao et al. | |
| 5,592,019 | A | 1/1997 | Ueda et al. | |
| 5,592,025 | A | 1/1997 | Clark et al. | |
| 5,594,274 | A | 1/1997 | Suetaki | |
| 5,595,934 | A | 1/1997 | Kim | |
| 5,604,376 | A | 2/1997 | Hamburgen et al. | |
| 5,608,265 | A | 3/1997 | Kitano et al. | |
| 5,608,267 | A | 3/1997 | Mahulikar et al. | |
| 5,622,873 | A | 4/1997 | Kim et al. | |
| 5,625,222 | A | 4/1997 | Yoneda et al. | |
| 5,631,191 | A * | 5/1997 | Durand et al. | 438/119 |
| 5,633,528 | A | 5/1997 | Abbott et al. | |
| 5,637,922 | A | 6/1997 | Fillion et al. | |
| 5,639,990 | A | 6/1997 | Nishihara et al. | |
| 5,640,047 | A | 6/1997 | Nakashima | |
| 5,641,997 | A | 6/1997 | Ohta et al. | |
| 5,643,433 | A | 7/1997 | Fukase et al. | |
| 5,644,169 | A | 7/1997 | Chun | |
| 5,646,831 | A | 7/1997 | Manteghi | |
| 5,650,663 | A | 7/1997 | Parthasarathi | |
| 5,661,088 | A | 8/1997 | Tessier et al. | |
| 5,665,996 | A | 9/1997 | Williams et al. | |
| 5,673,479 | A | 10/1997 | Hawthorne | |
| 5,683,806 | A | 11/1997 | Sakumoto et al. | |
| 5,683,943 | A | 11/1997 | Yamada | |
| 5,689,135 | A | 11/1997 | Ball | |
| 5,696,666 | A | 12/1997 | Miles et al. | |
| 5,701,034 | A | 12/1997 | Marrs | |
| 5,703,407 | A | 12/1997 | Hori | |
| 5,710,064 | A | 1/1998 | Song et al. | |
| 5,723,899 | A | 3/1998 | Shin | |
| 5,724,233 | A | 3/1998 | Honda et al. | |
| 5,726,493 | A | 3/1998 | Yamashita | |
| 5,736,432 | A | 4/1998 | Mackessy | |
| 5,745,984 | A | 5/1998 | Cole, Jr. et al. | |
| 5,748,658 | A * | 5/1998 | Nakanishi et al. | 372/43.01 |
| 5,753,532 | A | 5/1998 | Sim | |
| 5,753,977 | A | 5/1998 | Kusaka et al. | |
| 5,766,972 | A | 6/1998 | Takahashi et al. | |
| 5,767,566 | A | 6/1998 | Suda | |
| 5,770,888 | A | 6/1998 | Song et al. | |
| 5,776,798 | A | 7/1998 | Quan et al. | |
| 5,783,861 | A | 7/1998 | Son | |
| 5,801,440 | A | 9/1998 | Chu et al. | |
| 5,814,877 | A | 9/1998 | Diffenderfer et al. | |
| 5,814,881 | A | 9/1998 | Alagaratnam et al. | |
| 5,814,883 | A | 9/1998 | Sawai et al. | |
| 5,814,884 | A | 9/1998 | Davies et al. | |
| 5,817,540 | A | 10/1998 | Wark | |
| 5,818,105 | A | 10/1998 | Kouda | |
| 5,821,457 | A | 10/1998 | Mosley et al. | |
| 5,821,615 | A | 10/1998 | Lee | |
| 5,834,830 | A | 11/1998 | Cho | |
| 5,835,988 | A | 11/1998 | Ishii | |
| 5,844,306 | A | 12/1998 | Fujita et al. | |
| 5,854,511 | A | 12/1998 | Shin et al. | |
| 5,854,512 | A | 12/1998 | Manteghi | |
| 5,856,911 | A | 1/1999 | Riley | |
| 5,859,471 | A | 1/1999 | Kuraishi et al. | |
| 5,866,939 | A | 2/1999 | Shin et al. | |
| 5,866,942 | A | 2/1999 | Suzuki et al. | |
| 5,871,782 | A | 2/1999 | Choi | |
| 5,874,784 | A | 2/1999 | Aoki et al. | |
| 5,877,043 | A | 3/1999 | Alcoe et al. | |
| 5,886,397 | A | 3/1999 | Ewer | |
| 5,973,935 | A | 10/1999 | Schoenfeld et al. | |
| 5,977,630 | A | 11/1999 | Woodworth et al. | |
| 5,998,867 | A * | 12/1999 | Jensen et al. | 257/729 |
| 6,005,287 | A * | 12/1999 | Kaiya et al. | 257/674 |
| 6,040,626 | A | 3/2000 | Cheah et al. | |
| RE36,773 | E | 7/2000 | Nomi et al. | |

(56) References Cited

U.S. PATENT DOCUMENTS

| | | | |
|---|---|---|---|
| 6,107,679 A | 8/2000 | Noguchi |
| 6,143,981 A | 11/2000 | Glenn |
| 6,150,709 A | 11/2000 | Shin et al. |
| 6,166,430 A | 12/2000 | Yamaguchi |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | McClellan et al. |
| 6,229,205 B1 | 5/2001 | Jeong et al. |
| 6,238,952 B1 | 5/2001 | Lin et al. |
| 6,239,367 B1 | 5/2001 | Hsuan et al. |
| 6,239,384 B1 | 5/2001 | Smith et al. |
| 6,242,281 B1 | 6/2001 | McClellan et al. |
| 6,256,200 B1 | 7/2001 | Lam et al. |
| 6,258,629 B1 | 7/2001 | Niones et al. |
| 6,261,864 B1 | 7/2001 | Jung et al. |
| 6,281,566 B1 | 8/2001 | Magni |
| 6,281,568 B1 * | 8/2001 | Glenn et al. ............... 257/684 |
| 6,282,094 B1 | 8/2001 | Lo et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,306,685 B1 | 10/2001 | Liu et al. |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,252 B1 | 1/2002 | Niones et al. |
| 6,339,255 B1 | 1/2002 | Shin |
| 6,342,730 B1 | 1/2002 | Jung et al. |
| 6,348,726 B1 | 2/2002 | Bayan et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,395,972 B1 | 5/2002 | Tran et al. |
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,423,643 B1 | 7/2002 | Furuhata et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,465,883 B2 | 10/2002 | Olofsson |
| 6,472,735 B2 | 10/2002 | Isaak |
| 6,475,646 B2 | 11/2002 | Park et al. |
| 6,476,469 B2 | 11/2002 | Huang et al. |
| 6,476,474 B1 | 11/2002 | Hung |
| 6,482,680 B1 | 11/2002 | Khor et al. |
| 6,483,178 B1 | 11/2002 | Chuang |
| 6,492,718 B2 | 12/2002 | Ohmori |
| 6,495,909 B2 | 12/2002 | Jung et al. |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,518,089 B2 | 2/2003 | Coyle |
| 6,525,942 B2 | 2/2003 | Huang et al. |
| 6,528,893 B2 | 3/2003 | Jung et al. |
| 6,534,849 B1 | 3/2003 | Gang |
| 6,545,332 B2 | 4/2003 | Huang |
| 6,545,345 B1 | 4/2003 | Glenn et al. |
| 6,552,421 B2 | 4/2003 | Kishimoto et al. |
| 6,559,525 B2 | 5/2003 | Huang |
| 6,566,168 B2 | 5/2003 | Gang |
| 6,576,986 B2 | 6/2003 | Kobayakawa |
| 6,580,161 B2 | 6/2003 | Kobayakawa |
| 6,583,503 B2 | 6/2003 | Akram et al. |
| 6,585,905 B1 | 7/2003 | Fan et al. |
| 6,603,196 B2 | 8/2003 | Lee et al. |
| 6,624,005 B1 | 9/2003 | DiCaprio et al. |
| 6,627,977 B1 | 9/2003 | Foster |
| 6,646,339 B1 | 11/2003 | Ku |
| 6,650,004 B1 | 11/2003 | Horie |
| 6,667,546 B2 | 12/2003 | Huang et al. |
| 6,677,663 B1 | 1/2004 | Ku et al. |
| 6,686,649 B1 | 2/2004 | Mathews et al. |
| 6,696,752 B2 | 2/2004 | Su et al. |
| 6,700,189 B2 | 3/2004 | Shibata |
| 6,707,138 B2 * | 3/2004 | Crowley et al. ............... 257/676 |
| 6,713,375 B2 | 3/2004 | Shenoy |
| 6,756,658 B1 | 6/2004 | Gillett |
| 6,757,178 B2 | 6/2004 | Okabe et al. |
| 6,794,740 B1 | 9/2004 | Edwards et al. |
| 6,800,936 B2 | 10/2004 | Kosemura et al. |
| 6,812,552 B2 | 11/2004 | Islam et al. |
| 6,818,973 B1 | 11/2004 | Foster |
| 6,844,615 B1 | 1/2005 | Edwards et al. |
| 6,858,919 B2 | 2/2005 | Seo et al. |
| 6,867,492 B2 | 3/2005 | Auburger et al. |
| 6,876,068 B1 | 4/2005 | Lee et al. |
| 6,878,571 B2 | 4/2005 | Isaak et al. |
| 6,897,552 B2 | 5/2005 | Nakao |
| 6,897,567 B2 | 5/2005 | Horie |
| 6,927,478 B2 | 8/2005 | Paek |
| 6,967,125 B2 | 11/2005 | Fee et al. |
| 6,995,459 B2 | 2/2006 | Lee et al. |
| 7,001,799 B1 | 2/2006 | Edwards et al. |
| 7,002,241 B1 | 2/2006 | Mostafazadeh |
| 7,002,805 B2 | 2/2006 | Lee et al. |
| 7,005,327 B2 | 2/2006 | Kung et al. |
| 7,015,571 B2 | 3/2006 | Chang et al. |
| 7,045,396 B2 | 5/2006 | Crowley et al. |
| 7,053,469 B2 | 5/2006 | Koh et al. |
| 7,075,816 B2 | 7/2006 | Fee et al. |
| 7,102,209 B1 | 9/2006 | Bayan et al. |
| 7,109,572 B2 | 9/2006 | Fee et al. |
| 7,185,426 B1 | 3/2007 | Hiner |
| 7,193,298 B2 | 3/2007 | Hong et al. |
| 7,211,471 B1 | 5/2007 | Foster |
| 7,245,007 B1 | 7/2007 | Foster |

(56) References Cited

U.S. PATENT DOCUMENTS

| | | | |
|---|---|---|---|
| 7,253,503 | B1 | 8/2007 | Fusaro et al. |
| 2001/0008305 | A1 | 7/2001 | McLellan et al. |
| 2001/0014538 | A1 | 8/2001 | Kwan et al. |
| 2002/0011654 | A1 | 1/2002 | Kimura |
| 2002/0024122 | A1 | 2/2002 | Jung et al. |
| 2002/0027297 | A1 | 3/2002 | Ikenaga et al. |
| 2002/0038873 | A1 | 4/2002 | Hiyoshi |
| 2002/0072147 | A1 | 6/2002 | Sayanagi et al. |
| 2002/0111009 | A1 | 8/2002 | Huang et al. |
| 2002/0140061 | A1 | 10/2002 | Lee |
| 2002/0140068 | A1 | 10/2002 | Lee et al. |
| 2002/0140081 | A1 | 10/2002 | Chou et al. |
| 2002/0158318 | A1 | 10/2002 | Chen |
| 2002/0163015 | A1 | 11/2002 | Lee et al. |
| 2002/0167060 | A1 | 11/2002 | Buijsman et al. |
| 2003/0006055 | A1 | 1/2003 | Chien-Hung et al. |
| 2003/0030131 | A1 | 2/2003 | Lee et al. |
| 2003/0059644 | A1 | 3/2003 | Datta et al. |
| 2003/0064548 | A1 | 4/2003 | Isaak |
| 2003/0073265 | A1 | 4/2003 | Hu et al. |
| 2003/0102537 | A1 | 6/2003 | McLellan et al. |
| 2003/0164554 | A1 | 9/2003 | Fee et al. |
| 2003/0168719 | A1 | 9/2003 | Cheng et al. |
| 2003/0198032 | A1 | 10/2003 | Collander et al. |
| 2004/0027788 | A1 | 2/2004 | Chiu et al. |
| 2004/0056277 | A1 | 3/2004 | Karnezos |
| 2004/0061212 | A1 | 4/2004 | Karnezos |
| 2004/0061213 | A1 | 4/2004 | Karnezos |
| 2004/0063242 | A1 | 4/2004 | Karnezos |
| 2004/0063246 | A1 | 4/2004 | Karnezos |
| 2004/0065963 | A1 | 4/2004 | Karnezos |
| 2004/0080025 | A1 | 4/2004 | Kasahara et al. |
| 2004/0089926 | A1 | 5/2004 | Hsu et al. |
| 2004/0164387 | A1 | 8/2004 | Ikenaga et al. |
| 2004/0222484 | A1* | 11/2004 | Saxelby et al. ............... 257/502 |
| 2004/0253803 | A1 | 12/2004 | Tomono et al. |
| 2005/0133878 | A1* | 6/2005 | Huang ............................ 257/433 |
| 2005/0161777 | A1 | 7/2005 | Horie |
| 2005/0194538 | A1* | 9/2005 | Kurz ............................ 250/338.1 |
| 2006/0006506 | A1 | 1/2006 | Watanabe et al. |
| 2006/0087020 | A1 | 4/2006 | Hirano et al. |
| 2006/0108669 | A1* | 5/2006 | Matsumoto et al. .......... 257/666 |
| 2006/0157843 | A1 | 7/2006 | Hwang |
| 2006/0231939 | A1 | 10/2006 | Kawabata et al. |
| 2007/0023202 | A1 | 2/2007 | Shibata |
| 2007/0096160 | A1* | 5/2007 | Beroz et al. .................... 257/232 |
| 2007/0178630 | A1* | 8/2007 | Huang ............................ 438/116 |
| 2007/0187629 | A1* | 8/2007 | Matsuyama ................... 250/551 |
| 2007/0252246 | A1* | 11/2007 | Ng et al. ......................... 257/666 |
| 2007/0296077 | A1* | 12/2007 | Moline .......................... 257/712 |
| 2008/0123328 | A1* | 5/2008 | Lai et al. ......................... 362/183 |
| 2008/0230887 | A1 | 9/2008 | Sun |
| 2008/0295888 | A1* | 12/2008 | Lai et al. ......................... 136/259 |
| 2009/0085051 | A1* | 4/2009 | Hsieh et al. ..................... 257/98 |
| 2009/0114265 | A1* | 5/2009 | Milbourne et al. ........... 136/246 |
| 2009/0120499 | A1* | 5/2009 | Prather et al. ................. 136/259 |
| 2009/0159128 | A1* | 6/2009 | Shook et al. ................... 136/259 |
| 2010/0259909 | A1* | 10/2010 | Ho et al. ........................ 361/767 |

FOREIGN PATENT DOCUMENTS

| | | |
|---|---|---|
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 652333 | 9/1994 |
| JP | 6252333 | 9/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| JP | 2003243595 | 8/2003 |
| JP | 2004158753 | 6/2004 |
| JP | 2008-294219 | * 12/2008 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

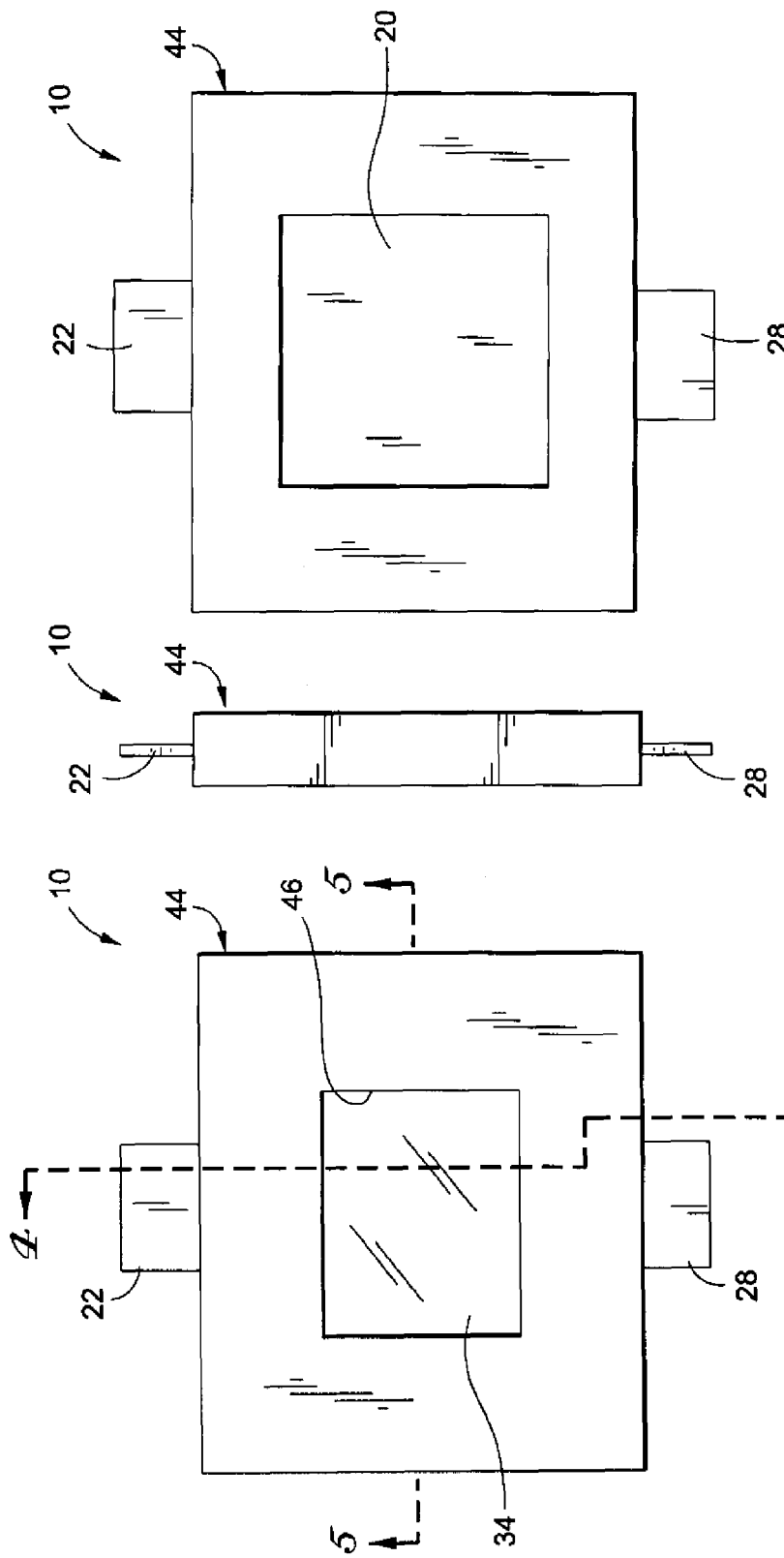

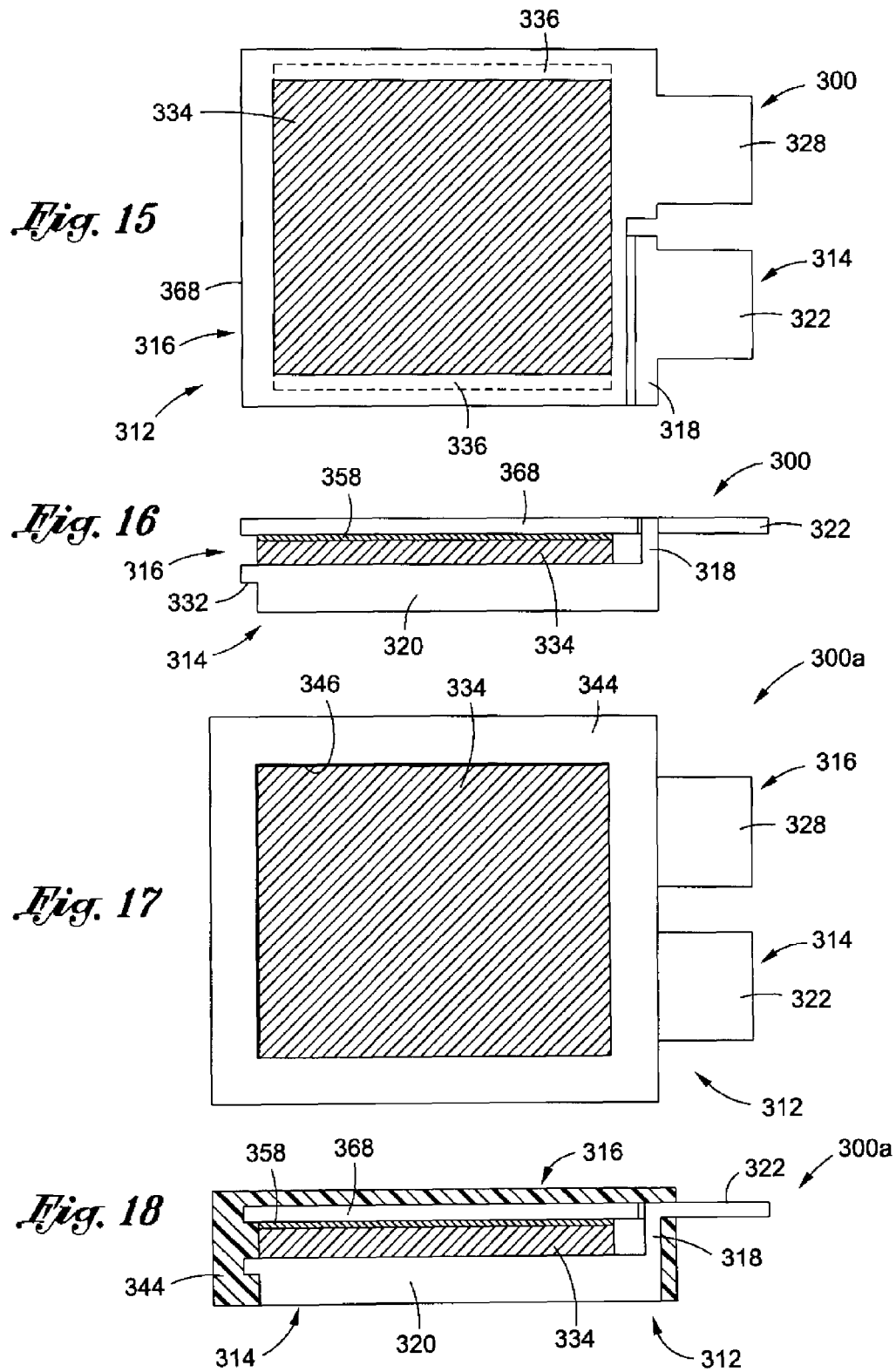

LEADFRAME STRUCTURE FOR CONCENTRATED PHOTOVOLTAIC RECEIVER PACKAGE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Technical Field of the Invention

The present invention relates generally to semiconductor devices, and more particularly to a robust, cost effective leadframe structure suitable for a concentrated photovoltaic (CPV) receiver module.

2. Description of the Related Art

Photovoltaic cells are a well known means for producing electrical current from electromagnetic radiation. Traditional photovoltaic cells comprise junction diodes fabricated from appropriately doped semiconductor materials. Such devices are typically fabricated as thin, flat wafers with the junction formed parallel to and near one of the flat surfaces. Photovoltaic cells are intended to be illuminated through their so-called "front" surface. Electromagnetic radiation absorbed by the semiconductor produces electron-hole pairs in the semiconductor. These electron-hole pairs may be separated by the electric field of the junction, thereby producing a photocurrent.

There is currently known in the electrical arts semiconductor devices known as CPV receiver die packages or modules. Currently known CPV modules typically comprise a ceramic substrate having a conductive pattern disposed on one side or face thereof. Attached to the substrate and electrically connected to the conductive pattern are electrical components, including a pair of preformed wire connectors and a packaged diode. Also attached to the substrate and electrically connected to the conductive pattern thereof is a receiver die. The electrical connection between the receiver die and the conductive pattern is often facilitated by a pair of braided ribbon connectors which extend along respective ones of opposed sides of the receiver die, which typically has a quadrangular or square configuration. The CPV module may further include a light concentration means which is adapted to concentrate solar radiation onto the front surface of the receiver die.

However, one of the major disadvantages associated with currently known CPV modules is attributable to the relatively high cost associated with their assembly and testing. Another deficiency lies with the lower conversion efficiency resulting from the higher receiver die temperatures. These higher temperatures of the receiver die are often attributable to the inefficiencies of known CPV modules in dissipating heat. The present invention addresses these and other shortcomings of prior art CPV modules, as will be described in more detail below.

BRIEF SUMMARY OF THE INVENTION

In accordance with one embodiment of the present invention, there is provided a robust, compact CPV (concentrated photovoltaic) receiver package or module which comprises a strip-based leadframe substrate with solder receiver die attach and multiple wire bonds. The module is finished by film-assist molding to expose the receiver die surface on a first side thereof, and a heat slug or heat sink on a second side thereof opposite the first side. Thus, the CPV module provides effective thermal dissipation, wire protection, electrical insulation, strip-level assembly and test capability, as well as molded alignment features which are adapted to accommodate an electromagnetic radiation concentration device such as a light guide or optical rod which concentrates solar radiation onto the receiver die.

More particularly, the multiple wire bonds included in the CPV module of the aforementioned embodiment provide for high power transmission, with the molded body included therein providing protection for the bond wires, as well as molded features for light guide or optical rod alignment. This CPV module also includes integrated leads for cabling, and the aforementioned built-in, exposed heat sink for heat dissipation. Further, the strip based assembly and test capability of such CPV module allows for the full automation of the assembly and testing thereof, thus providing significant cost benefits in relation to the fabrication process. In sum, as indicated above, the aforementioned CPV module provides a cost-effective, robust, compact package which uses film-assist molding of durable molding material, and includes multiple wire bonds, an exposed thermal pad (heat sink), exposed easy-access connectors, and molded-in features to help align an optical rod or light guide. As a result, such CPV module provides the required combination of good thermal dissipation to the heat sink, protection against intense, focused sunlight, high voltage potential isolation, accurate alignment of the optical rod or light guide, and ease of wiring connection.

In accordance with additional embodiments of the present invention, there is provided a CPV receiver package or module which has a robust, cost effective leadframe structure, and wherein the front surface of the receiver die is clear of obstruction for maximum sunlight reception, and the back surface of the receiver die is provided with a modality for good thermal dissipation. More particularly, in these additional embodiments of the CPV module, a receiver die is first attached to a bottom leadframe (bare or pre-molded with alignment features) using solder or other conductive die attach materials. A top leadframe with a generally U-shaped fork shape, or a quadrangular (e.g., square) shape, is then laid over the bottom frame. The electrical connection to the top of the receiver die is carried out by forming bonds with the top contact strips on two sides of the receiver die using solder or other conductive adhesives.

In these additional embodiments of the CPV module, no wire bonds, ribbon bonds, or flip chip bumps are needed. Additionally, the CPV module has an exposed top window for sunlight reception and an exposed bottom heat sink for thermal dissipation. As indicated above, the CPV module in these additional embodiments can be fabricated with a bare leadframe, a pre-molded bottom leadframe, or an over-mold for better strength. As also indicated above, the top leadframe can also have raised edges to serve as an alignment mechanism to assist the alignment with a light concentrating optical rod or light guide of the system. Additionally, the connectors of the CPV module may be provided with through holes for the screw fastening of electrical wires, with the CPV module also including integrated leads for cabling. Electrical connectors can also be located on the same side or opposite sides of the CPV module by rotating the top leadframe approximately 180°, with the top leadframe also optionally including a downset to secure connection with the contacts of the receiver die. Further, the strip based assembly and test capability of these additional embodiments of the CPV module allows for the full automation of the assembly and testing thereof, thus providing significant cost benefits in relation to the fabrication process.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIG. 1 is a top plan view of a CPV module constructed in accordance with a first embodiment of the present invention;

FIG. 2 is a bottom plan view of the CPV module shown in FIG. 1;

FIG. 3 is a side-elevational view of the CPV module shown in FIGS. 1 and 2;

FIG. 15 is a top plan view of a CPV module constructed in accordance with a fourth embodiment of the present invention;

FIG. 16 is a side-elevational view of the CPV module shown in FIG. 15;

FIG. 17 is a top plan view of a variant of the CPV module shown in FIGS. 15 and 16 and including a molded body;

FIG. 18 is a side-elevational view of the CPV module shown in FIG. 17; and

Common reference numerals are used throughout the drawings and detailed description to indicate like elements.

DETAILED DESCRIPTION OF THE INVENTION

Figure 4:
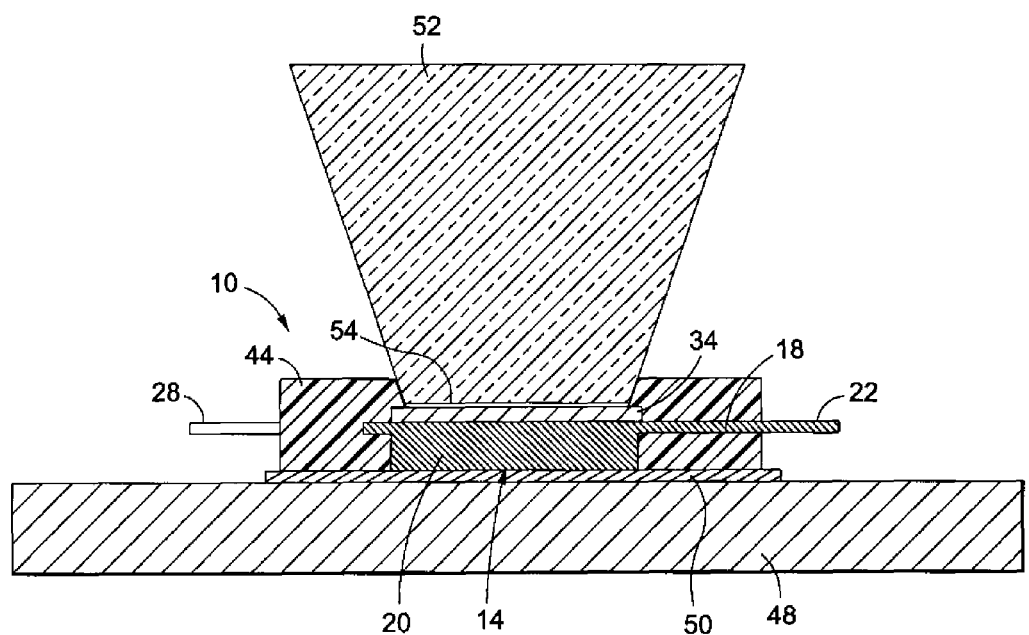
FIG. 4 is a cross-sectional view taken along line 4-4 of FIG. 1, further depicting the CPV module as being secured to an underlying heat sink and including an optical rod operatively coupled thereto.
Figure 5:
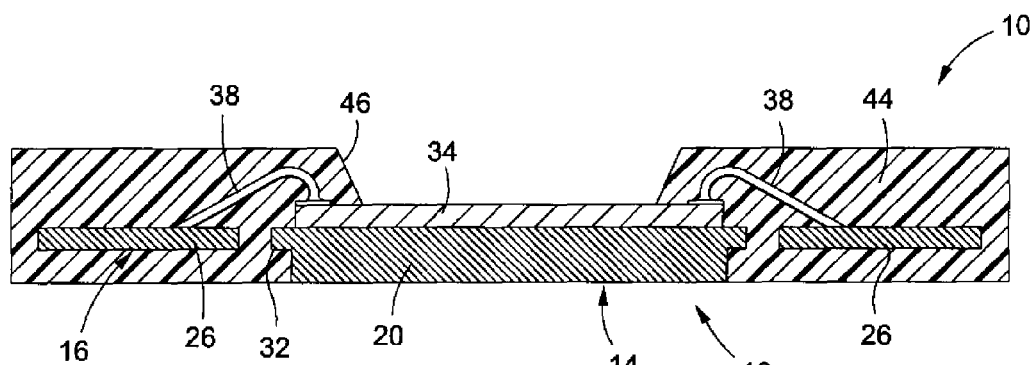
FIG. 5 is a cross-sectional view taken along line 5-5 of FIG. 1.
Figure 6:
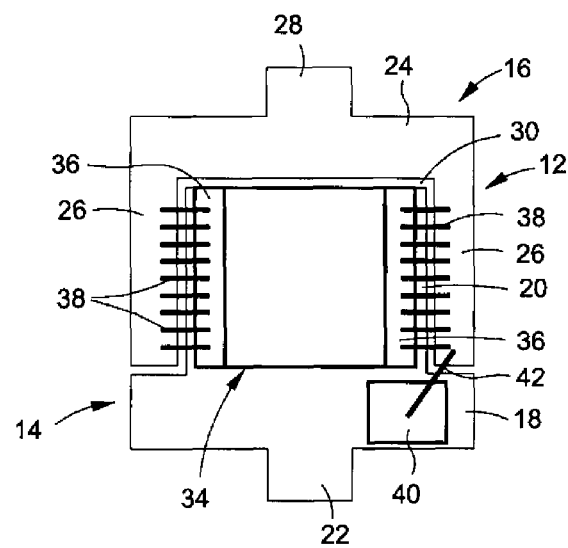
FIG. 6 is a top plan view of the CPV module shown in FIG. 1 prior to the formation of the molded body thereon.

Referring now to the drawings wherein the showings are for purposes of illustrating preferred embodiments of the present invention only, and not for purposes of limiting the same, FIGS. 1-5 and 6 depict a CPV module 10 constructed in accordance with a first embodiment of the present invention. As best seen in FIG. 6, the module 10 comprises a leadframe 12 which is preferably fabricated from a conductive metal material, such as copper. The leadframe 12 includes a first section 14 and a separate second section 16. The first section 14 includes a generally rectangular base portion 18 which defines opposed pairs of longitudinally and laterally extending side edges. In addition to the base portion 18, the first section 14 includes a generally square die pad portion 20 which protrudes from one of the longitudinally extending side edges of the base portion 18. Extending from the approximate center of the longitudinally extending side edge of the base portion 18 opposite the side edge from which the die pad portion 20 extends is a generally quadrangular connector portion 22 of the first section 14.

The second section 16 of the leadframe 12 includes a generally rectangular base portion 24 defining opposed pairs of longitudinally and laterally extending side edges. In addition to the base portion 24, the second section 16 includes an identically configured pair of prong portions 26 which extend in spaced, generally parallel relation to each other from a common longitudinally extending side edge of the base portion 24. Additionally, extending from the longitudinally extending side edge of the base portion 24 opposite the side edge having the prong portions 26 extending therefrom is a generally quadrangular connector portion 28 of the second section 16, the connector portion 28 being identically configured to the connector portion 22 of the first section 14. As is further seen in FIG. 6, the base portion 24 and prong portions 26 of the second section 16 collectively define a generally square gap or recess 30 which is sized and configured to accommodate the die pad portion 20 of the first section 14. More particularly, in the leadframe 12, the first and second sections 14, 16 are oriented relative to each other such that the die pad portion 20 is disposed within the recess 30. However, the first and second sections 14, 16 are maintained in spaced relation to each other, with a continuous gap or void being defined therebetween as shown in FIG. 6.

As most apparent from FIGS. 4 and 5, in the leadframe 12, the first section 14 is not of uniform thickness. Rather, it is contemplated that the first section 14 will be subjected to a partial etching process such that the base, die pad and connector portions 18, 20, 22 define generally planar top surfaces which extend in generally co-planar relation to each other, the die pad portion 20 defines a generally planar bottom surface which is disposed in opposed relation to the top surface thereof, and the base and connector portions 18, 20 define generally planar bottom surfaces which extend in generally co-planar relation to each other, but are perpendicularly recessed relative to the bottom surface of the die pad portion 20. It is also contemplated that the die pad portion 20 may be partially etched so as to define a shoulder or shelf 32 which extends along those three side surfaces thereof protruding from the base portion 18. The shelf 32 is perpendicularly recessed relative to the bottom surface of the die pad portion 20, and extends in opposed relation to the top surface thereof.

The shelf 32 also extends in generally co-planar relation to the bottom surfaces of the base and connector portions 18, 22. The use of the shelf 32 will be described in more detail below.

Despite the first section 14 being partially etched as described above, it is contemplated that the second section 16 of the leadframe 12 will be of substantially uniform thickness. In this regard, the base, prong and connector portions 24, 26, 28 define generally planar top surfaces which extend in generally co-planar relation to each other. The top surfaces of the base, prong and connector portions 24, 26, 28 also extend in generally co-planar relation to the top surfaces of the base, die pad and connector portions 18, 20, 22 of the first section 14 in the fully formed module 10. The base, prong and connector portions 24, 26, 28 also define generally planar bottom surfaces which extend in generally co-planar relation to each other, and in generally co-planar relation to the bottom surfaces of the base and connector portions 18, 22 of the first section 14 in the fully formed module 10.

The module 10 constructed in accordance with the present invention further comprises a receiver die 34, the back or bottom surface of which is mounted and electrically connected to the top surface of the die pad portion 20 of the first section 14 of the leadframe 12. The receiver die 34 has a generally quadrangular (e.g., square) configuration, and includes two contact strips 36 disposed on the front or top surface thereof. As seen in FIG. 6, the contact strips 36 extend in spaced, generally parallel relation to each other along respective ones of an opposed pair of side edges of the receiver die 34. As further seen in FIG. 6, in the module 10, each of the contact strips 36 is electrically connected to a respective one of the prong portions 26 of the second section 16 of the leadframe 12 by a plurality of conductive wires 38.

In addition to the receiver die 34, the module 10 includes an electronic device 40 such as a packaged diode or a rectifier die attached to the top surface of the base portion 18 of the first section 14. The electronic device 40 is itself electrically connected to one of the prong portions 26 of the second section 16 through the use of at least one conductive wire 42.

In the module 10, the receiver die 34, the electronic device 40, the conductive wires 38, 42, and portions of the first and second sections 14, 16 of the leadframe 12 are covered by an encapsulant material which, upon hardening, defines a molded body 44 of the module 10. As seen in FIGS. 1-5, the body 44 has a generally square, frame-like configuration. More particularly, the body 44 is formed such that virtually the entire leadframe 12 is covered thereby, except for the connector portions 22, 28 and the bottom surface of the die pad portion 20. In this regard, the connector portions 22, 28 protrude from respective ones of an opposed pair of side surfaces defined by the body 44, with the bottom surface of the die pad portion 20 extending in substantially flush relation to a generally planar bottom surface defined by the body 44. In the completed module 10, the exposed connector portions 22, 28 define cabling flanges, and may optionally include apertures therein for the screw fastening of electrical wires. The top surface of the receiver die 34, except for a peripheral portion thereof, is exposed in a generally quadrangular window 46 defined by the body 44 and formed within the approximate center of the generally planar top surface thereof. As best seen in FIGS. 4 and 5, the window 46 has a tapered profile, i.e., those surfaces of the body 44 defining the window 46 extend angularly from the top surface of the body 44 to the top surface of the receiver die 34. As indicated above, the entirety of the electronic device 40 is covered by the body 44, as are the wires 38, 42. Though not shown in FIGS. 1-5, it is contemplated that the body 44 may alternatively be formed such that portions of the prong portions 26 of the second section 16 of the leadframe 12 protrude slightly from respective ones of an opposed pair of side surfaces of the body 44. The body 44 also covers the shelf 32 to create a firm mechanical interlock between the body 44 and the die pad portion 20 (and hence the first section 14 of the leadframe 12).

Referring now to FIG. 4, there is shown an exemplary operative environment for the module 10 having the above described structural attributes. As shown in FIG. 4, it is contemplated that the fully formed module 10 may be attached to an underlying heat sink 48 through the use of a layer 50 of a thermal interface material. Additionally, it is contemplated that a light concentrating device such as a light guide or optical rod 52 may be cooperatively engaged to the module 10. More particularly, one end of the optical rod 52 may be secured to that portion of the top surface of the receiver die 34 exposed in the window 46 through the use of a layer 54 of an index matching glue. As is also apparent from FIG. 4, the window 46 included in the body 44, and in particular the tapered or angled side walls of the body 44 defining the window 46, define an alignment feature which properly aligns the optical rod 52 over the receiver die 34. Advantageously, the exposed bottom surface of the die pad portion 20 within the body 44 acts as a heat sink and creates a thermal dissipation benefit in the module 10. More particularly, heat transferred from the receiver die 34 into the die pad portion 20 can in turn be transferred from the exposed bottom surface of the die pad portion 20 into the underlying heat sink 48 via the layer 50. Though the side walls of the body 44 defining the window 46 are described above as being tapered or angled to create an alignment feature for the optical rod 52, those of ordinary skill in the art will recognize that such side walls may alternatively be stepped or otherwise mechanically adapted in a manner adapted to facilitate the alignment of the optical rod 52 (or other light concentrating device) with the portion of the receiver die 34 exposed in the window 46.

Figure 7:
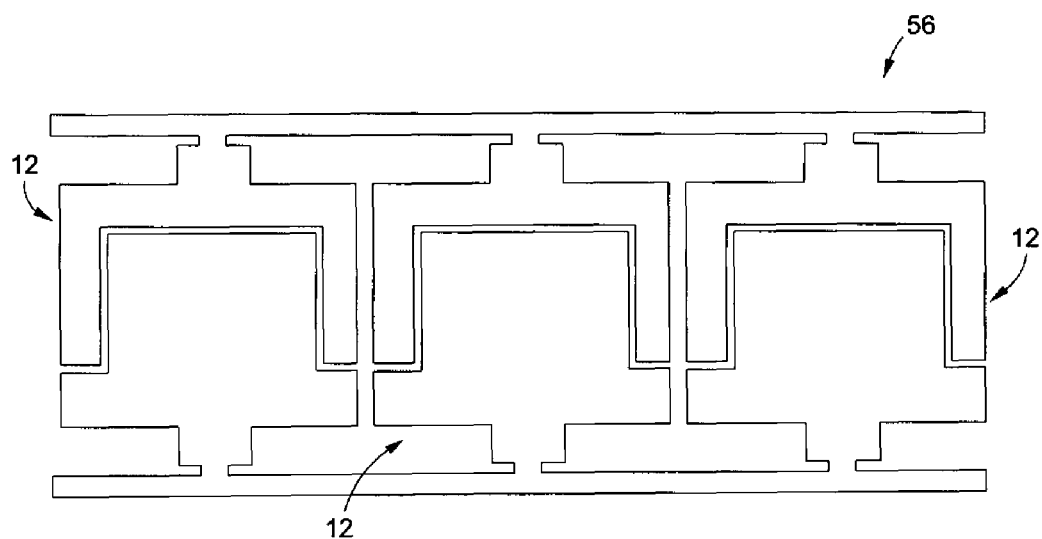
FIG. 7 is a top plan view of a portion of a leadframe strip which may be used to produce CPV modules of the first embodiment.

Due to the structural attributes of the leadframe 12 within the module 10, it is contemplated that multiple leadframes 12 may be provided in a common leadframe strip 56, an example of which is shown in FIG. 7. In this regard, since the module 10 is well suited to strip based assembly and test capability, the assembly and testing thereof can be fully automated, thus substantially reducing the fabrication costs associated with the module 10.

Figure 5A:
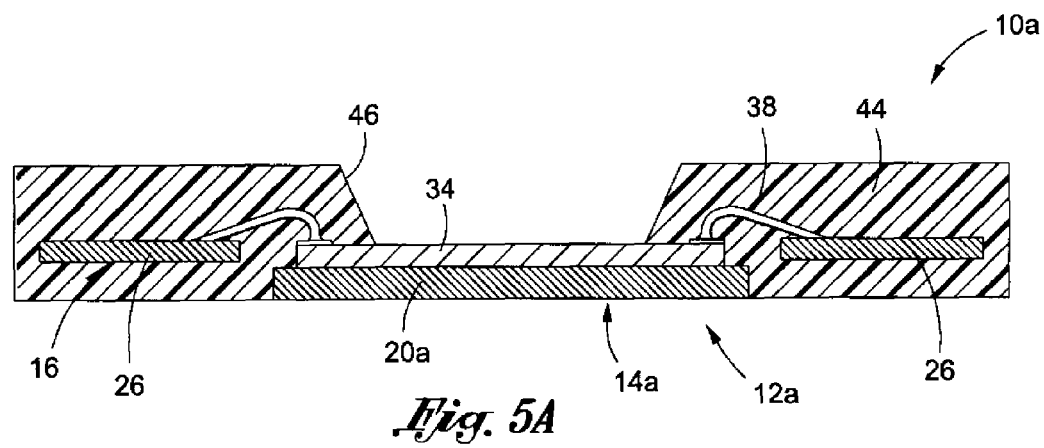
FIG. 5A is a cross-sectional view similar to FIG. 5, but depicting a downset variant of the CPV module shown in FIGS. 1-5.

Referring now to FIG. 5A, there is provided a cross-sectional view similar to FIG. 5, but depicting a CPV module 10a which constitutes a variant of the CPV module 10 described above. More particularly, the distinction between the modules 10a, 10 lies in the substitution of the above-described leadframe 12 of the module 10 with the leadframe 12a included in the module 10a. The leadframe 12a includes the above-described second section 16. However, in the leadframe 12a, the above-described first section 14 is replaced with the first section 14a which is of uniform thickness, and does not include the half-etched features described above in relation to the first section 14 of the leadframe 12. In this regard, in order for the generally planar bottom surface of the die pad portion 20a of the first section 14a to be exposed in the generally planar bottom surface of the body 44 in the manner shown in FIG. 5A, the base portion of the first section 14a is preferably formed to include a downset therein. As a result, the generally planar top surface of the die pad portion 20a does not extend in generally co-planar relation to the top surfaces of the base, prong and connector portions 24, 26, 28 of the second section 16, but rather is recessed relative thereto as shown in FIG. 5A.

Figure 8:
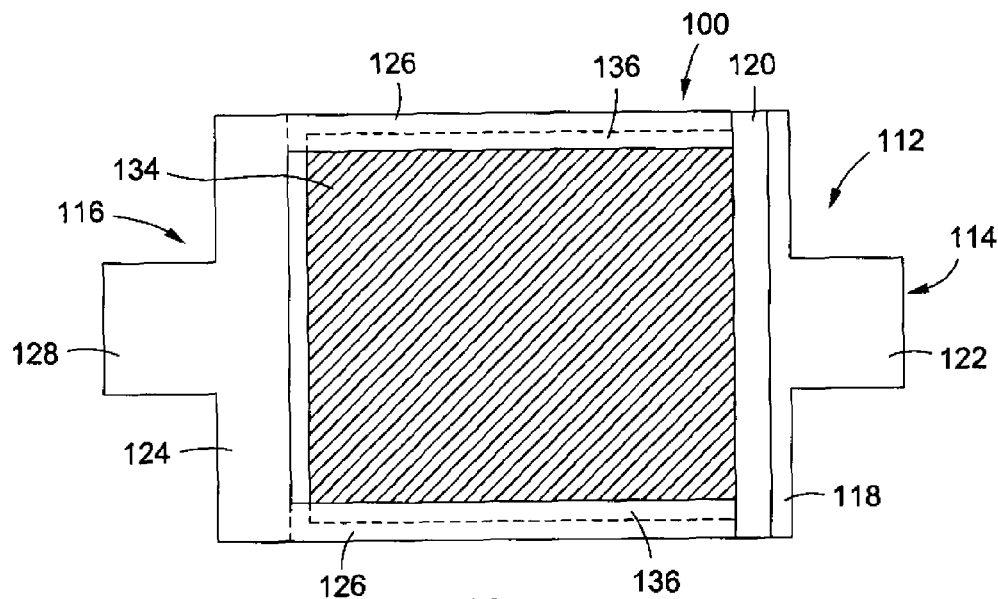
FIG. 8 is a top plan view of a CPV module constructed in accordance with a second embodiment of the present invention.
Figure 9:
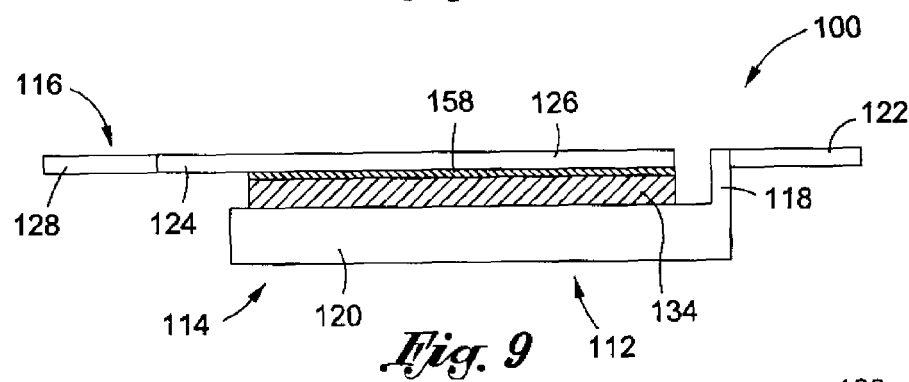
FIG. 9 is a side-elevational view of the CPV module shown in FIG. 8.

Referring now to FIGS. 8 and 9, there is shown a CPV module 100 constructed in accordance with a second embodiment of the present invention. The module 100 comprises a leadframe 112 which is preferably fabricated from a conductive metal material, such as copper. The leadframe 112 includes a first (bottom) section 114 and a separate second (top) section 116. The first section 114 includes a generally quadrangular die pad portion 120 which defines opposed, generally planar top and bottom surfaces. In addition to the die pad portion 120, the first section 114 includes a flange portion 118 which extends generally perpendicularly relative to the top surface of the die pad portion 120 along one of the side edges thereof. Extending perpendicularly from the approximate center of the distal edge of the flange portion 118 is a generally quadrangular connector portion 122 of the first section 114. Thus, in the first section 114, the die pad portion 120 and the connector portion 122 extend along respective ones of a spaced, generally parallel pair of planes, with the connector portion 122 being elevated above the die pad portion 120 when viewed from the perspective shown in FIG. 9. In the first section 114, the thickness of the die pad portion 120 exceeds the thicknesses of the flange and connector portions 118, 122 which are substantially equal to each other.

In the module 100, the back or bottom surface of a generally quadrangular (e.g., square) receiver die 134 is mounted and electrically connected to the top surface of the die pad portion 120 of the first section 114. Like the receiver die 34 described above, the receiver die 134 includes two contact strips 136 disposed on the front or top surface thereof, the contact strips 136 extending in spaced, generally parallel relation to each other along respective ones of an opposed pair of side edges of the receiver die 134.

The second section 116 of the leadframe 112 in the module 100 includes a generally rectangular base portion 124 defining opposed pairs of longitudinally and laterally extending side edges. In addition to the base portion 124, the second section 116 includes an identically configured pair of prong portions 126 which extend in spaced, generally parallel relation to each other from a common longitudinally extending side edge of the base portion 124. Additionally, extending from the longitudinally extending side edge of the base portion 124 opposite the side edge having the prong portions 126 extending therefrom is a generally quadrangular connector portion 128 of the second section 116, the connector portion 128 being identically configured to the connector portion 122 of the first section 114. As seen in FIG. 9, in contrast to the first section 114 wherein the die pad portion 120 and connector portion 122 extend along respective ones of two different planes as described above, the base, prong and connector portions 124, 126, 128 of the second section 16 each extend along a common plane, and are of substantially uniform thicknesses.

In the module 100, the generally planar bottom surfaces of the prong portions 126 of the second section 116 are electrically connected to respective ones of the contact strips 136 of the receiver die 134 through the use of respective layers or strips 158 of a conductive bonding material. Thus, the strips 158 effectively place the receiver die 134 into electrical communication with the second section 116 of the leadframe 112. Thus, the module 100 is devoid of any conductive wires. As seen in FIG. 9, in the fully assembled module 100, the thicknesses of the receiver die 134 and second section 116 are preferably such that the co-planar top surfaces of the base, prong and connector portions 124, 126, 128 of the second section 116 extend in generally co-planar relation to the generally planar top surface of the connector portion 122 of the first section 114. As is also apparent from FIG. 8, the central portion of the top surface of the receiver die 134 is exposed between the prong portions 126 of the second section 116, and further between the base portion 124 of the second section 116 and the flange portion 118 of the first section 114. Though not shown in FIGS. 8 and 9, it is contemplated that the connector portions 122, 128, which define cabling flanges, may also optionally include apertures therein for the screw fastening of electrical wires.

Figure 9A:
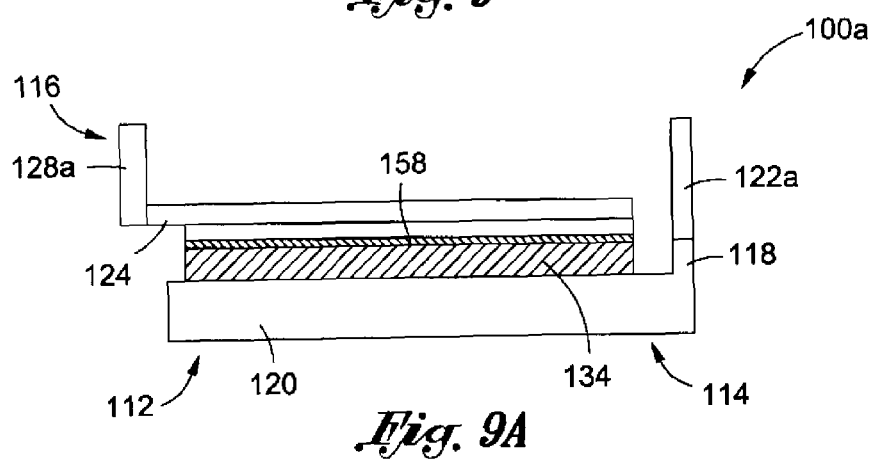
FIG. 9A is a side-elevational view similar to FIG. 9, but depicting a vertical connector variant of the CPV module shown in FIGS. 8 and 9.

Referring now to FIG. 9A, there is shown a CPV module 100a which comprises a first relatively minor variant of the above-described CPV module 100. In this regard, only the distinctions between the modules 100, 100a are described below. The sole distinction between the modules 100, 100a lies in the orientations of the connector portions 122a, 128a in the module 100a, in comparison to the orientations of the connector portions 122, 128 in the module 100. More particularly, in the module 100a, the connector portion 122a does not extend generally perpendicularly relative to the flange portion 118 of the first section 114 of the leadframe 112. Rather, like the flange portion 118, the connector portion 122a extends generally perpendicularly relative to the top surface of the die pad portion 120. Additionally, in the module 100a, the connector portion 128a of the second section 116 extends generally perpendicularly relative to the base portion 124 thereof, rather than in generally co-planar relation thereto.

Figure 10:
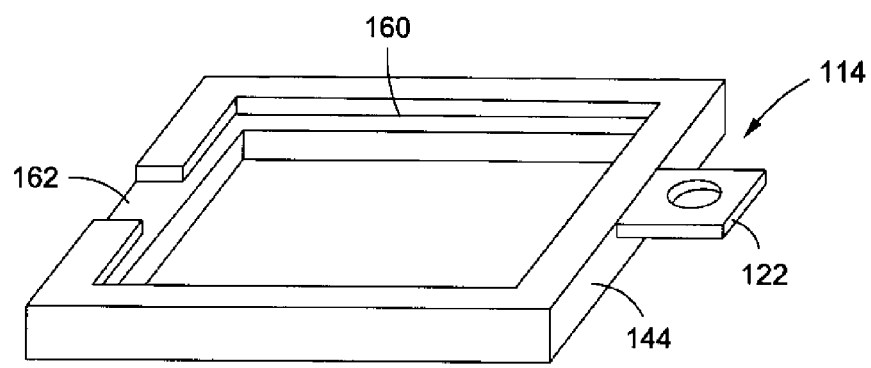
FIG. 10 is a top perspective view of a pre-molded variant of the bottom leadframe of the CPV module shown in FIGS. 8 and 9.
Figure 11:
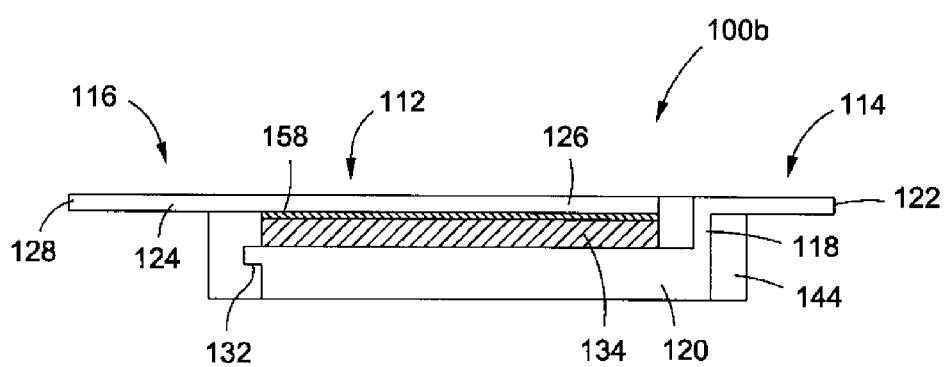
FIG. 11 is a cross-sectional view of a CPV module similar to that shown in FIGS. 8 and 9, but including the pre-molded variant of the bottom leadframe shown in FIG. 10.

Referring now to FIGS. 10 and 11, there is shown a CPV module 100b which comprises a second variant of the above-described CPV module 100. Only the distinctions between the modules 100, 100b are described below. The primary distinction between the modules 100, 100b lies in the first section 114 of the leadframe 112 in the module 100b being pre-molded, i.e., having an encapsulant material applied thereto which, upon hardening, forms a molded body 144 on the first section 114. As seen in FIG. 10, the molded body 144 has a generally quadrangular, frame-like configuration. The body 144 is formed such that it extends about and covers the peripheral side surfaces of the die pad portion 120 of the first section 114. The body 144 also covers a peripheral portion of the top surface of the die pad portion 120. However, as seen in FIG. 11, the bottom surface of the die pad portion 120 is exposed in and substantially flush with the generally planar bottom surface defined by the body 144. In addition, the body 144 covers the entirety of the flange portion 118 of the first section 114, and a portion of the generally planar bottom surface of the connector portion 122 thereof. However, the generally planar top surface of the connector portion 122 extends in substantially flush relation to the generally planar top surface defined by the body 144. In FIG. 10, the connector portion 122 of the first section 114 is depicted as including one of the above-described apertures for the screw fastening of electrical wires.

As further seen in FIG. 10, the body 144 is formed to include a three-sided shelf 160 which is perpendicularly recessed relative to the top surface thereof. In this regard, the shelf 160 extends along those sides of the frame-like body 144 other for than that side which extends along and covers the flange portion 118 of the first section 114. Additionally, formed within the top surface of that side of the body 144 opposite the side covering the flange portion 118 is a generally quadrangular recess 162 which extends to the shelf 160. As seen in FIG. 11, in the fully assembled module 100b, the second section 116 of the leadframe 112 is nested within the body 144 such that outer, peripheral portions of both the base portion 124 and prong portions 126 rests upon the shelf 160. In this respect, the recess 162 accommodates a portion of the connector portion 128 of the second section 116 when the base and prong portions 124, 126 thereof are rested on the shelf 160 in the aforementioned manner. As indicated above, the depth of the shelf 160 and the recess 162 relative to the top surface of the body 144 are equal to each other, with such depth being selected such that the generally planar top surfaces of the base, prong and connector portions 124, 126, 128 of the second section 116 extend in substantially flush, co-planar relation to the top surface of the body 144 when the second section 116 is nested therein. In the module 100b, those inner portions of the prong portions 126 not resting on the shelf 160 are electrically connected to the receiver die 134 in the above-described manner through the use of the aforementioned strips 158 of conductive bonding material.

A further distinction between the modules 100, 100b lies in the structural attributes of the die pad portion 120 in the first section 114 of the leadframe 112 included in the module 100b, in comparison to the die pad portion 120 included in the first section 114 of the leadframe 112 included in the module 100. More particularly, the die pad portion 120 of the module 100b is preferably partially etched so as to define a shoulder or shelf 132 which extends along three of the four side surfaces thereof. In this regard, the shelf 132 does not extend along that side surface of the die pad portion 120 to which the flange portion 118 is integrally connected. The shelf 132 is perpendicularly recessed relative to the bottom surface of the die pad portion 120, and extends in opposed relation to the top surface thereof. The shelf 132 is covered by the fully formed body 144, thus creating a firm mechanical interlock between the body 144 and the die pad portion 120 (and hence the first section 114 of the leadframe 112).

Figure 12:
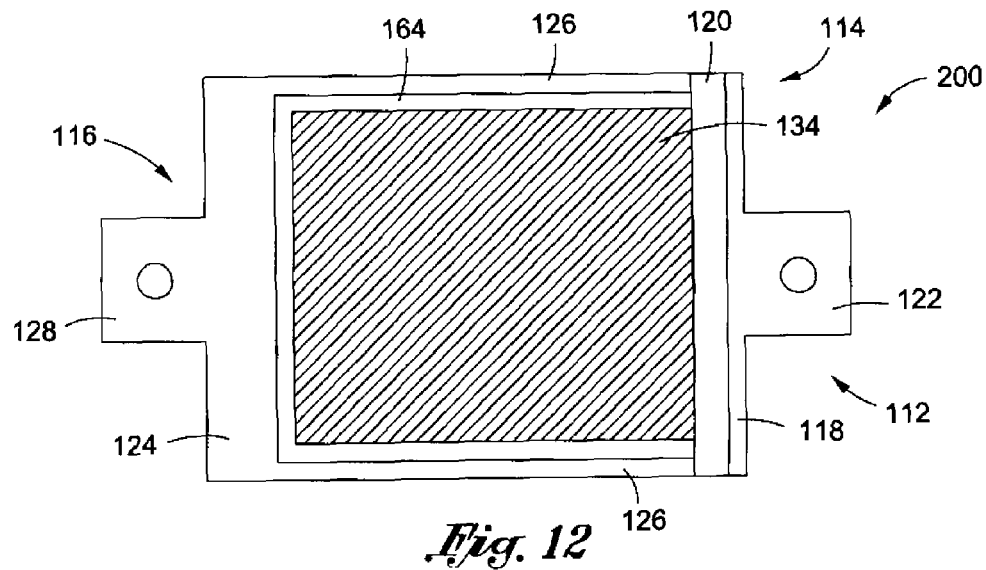
FIG. 12 is a top plan view of a CPV module constructed in accordance with a third embodiment of the present invention.

Referring now to FIG. 12, there is shown a CPV module 200 constructed in accordance with a third embodiment of the present invention. The CPV module 200 is substantially similar to the above-described CPV module 100, with only the distinctions between the CPV modules 200, 100 being described below.

Figure 13:
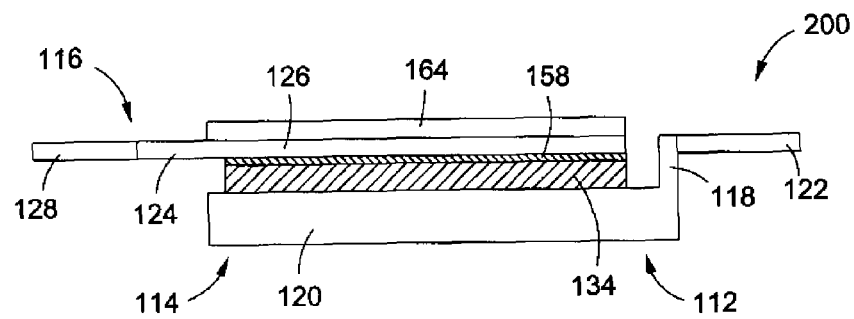
FIG. 13 is a side-elevational view of the CPV module shown in FIG. 12.

The sole distinction between the CPV modules 200, 100 lies in the second section 116 of the leadframe 112 included in the module 200 further defining a raised lip or edge 164. As seen in FIGS. 12 and 13, the edge 164 has a three-sided configuration, and extends along the inner edges of the prong portions 136 of the second section 116, as well as a portion of the inner edge of the base portion 124 thereof. The raised edge 164 included with the first section 116 of the leadframe 112 of the module 200 is used to define an alignment feature which properly aligns a light concentrating device such as a light guide or optical rod over the receiver die 134 of the module 200. Additionally, in the module 200, the connector portions 122, 128 are each depicted as including the above-described apertures for the screw fastening of electrical wires.

Figure 13A:
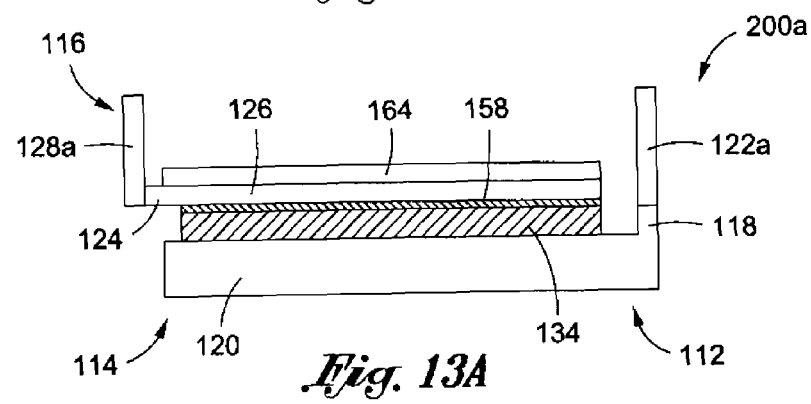
FIG. 13A is a side-elevational view similar to FIG. 13, but depicting a vertical connector variant of the CPV module shown in FIGS. 12 and 13.

Referring now to FIG. 13A, there is shown a CPV module 200a which comprises a first relatively minor variant of the above-described CPV module 200. In this regard, only the distinctions between the modules 200, 200a are described below. The sole distinction between the modules 200, 200a lies in the orientations of the connector portions 122a, 128a in the module 200a, in comparison to the orientations of the connector portions 122, 128 in the module 200. More particularly, in the module 200a, the connector portion 122a does not extend generally perpendicularly relative to the flange portion 118 of the first section 114 of the leadframe 112. Rather, like the flange portion 118, the connector portion 122a extends generally perpendicularly relative to the top surface of the die pad portion 120. Additionally, in the module 200a, the connector portion 128a of the second section 116 extends generally perpendicularly relative to the base portion 124 thereof, rather than in generally co-planar relation thereto.

Figure 14:
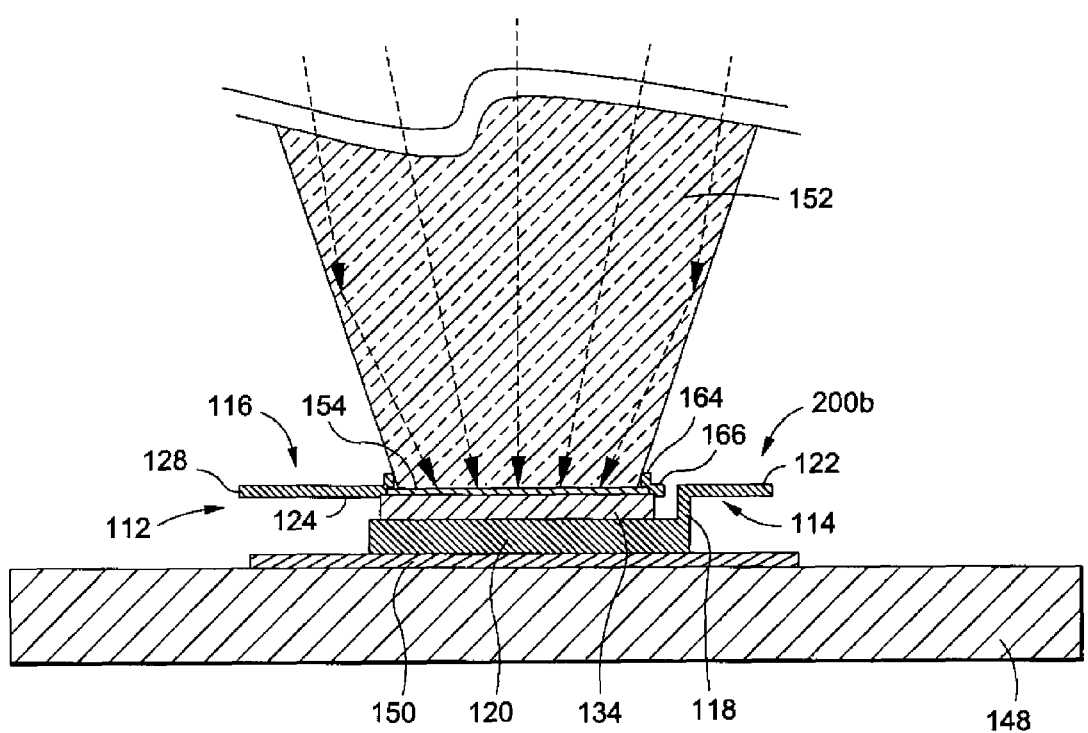
FIG. 14 is a cross-sectional view of a variant of the CPV module shown in FIGS. 12 and 13, further depicting the CPV module as being secured to an underlying heat sink and including an optical rod operatively coupled thereto.

Referring now to FIG. 14, there is shown a CPV module 200b which comprises a second variant of the above-described CPV module 200. Only the distinctions between the modules 200, 200b are described below. The sole distinction between the modules 200, 200b lies in the second section 116 of the leadframe 112 in the module 200b further including a cross member portion 166 which extends between and interconnects the distal ends of the prong portions 126. Additionally, in the first section 116 of the leadframe 112 included in the module 200b, the raised edge 164 has a generally quadrangular, four-sided configuration, and extends along the inner edge of the cross member portion 166, in addition to the inner edges of the prong portions 136 and the inner edge of the base portion 124.

In FIG. 14, the module 200b is shown in an exemplary operative environment. More particularly, the module 200b is shown as being attached to an underlying heat sink 148 though the use of a layer 150 of a thermal interface material. Additionally, a light concentrating device such a light guide or optical rod 152 is cooperatively engaged to the module 200b. More particularly, one end of the optical rod 152 is secured to that portion of the front or top surface of the receiver die 134 exposed within the raised edge 164 through the use of a layer 154 of an index matching glue. The raised edge 164 included with the second section 116 of the leadframe 112 creates an alignment feature which properly aligns the optical rod 152 over the receiver die 134. Additionally, the die pad portion 120 of the first section 114 of the leadframe 112, and in particular the bottom surface thereof, acts as a heat sink and creates a thermal dissipation benefit in the module 200b. More particularly, heat transferred from the receiver die 134 into the die pad portion 120 can in turn be transferred from the bottom surface of the die pad portion 120 into the underlying heat sink 148 via the layer 150.

Referring now to FIGS. 15 and 16, there is shown a CPV module 300 constructed in accordance with a fourth embodiment of the present invention. The module 300 comprises a leadframe 312 which is preferably fabricated from a conductive metal material, such as copper. The leadframe 312 includes a first (bottom) section 314 and a separate second (top) section 316. The first section 314 includes a generally quadrangular die pad portion 320 which defines opposed, generally planar top and bottom surfaces. In addition to the die pad portion 320, the first section 314 includes a flange portion 318 which extends generally perpendicularly relative to the top surface of the die pad portion 320 along approximately half the length of one of the side edges thereof. Extending perpendicularly from the distal edge of the flange portion 318 is a generally quadrangular connector portion 322 of the first section 314. Thus, in the first section 314, the die pad portion 320 and the connector portion 322 extend along respective ones of a spaced, generally parallel pair of planes, with the connector portion 322 being elevated above the die pad portion 320 when viewed from the perspective shown in FIG. 16. In the first section 314, the thickness of the die pad portion 320 exceeds the thicknesses of the flange and connector portions 318, 322 which are substantially equal to each other.

In the module 300, the back or bottom surface of a generally quadrangular (e.g., square) receiver die 334 is mounted and electrically connected to the top surface of the die pad portion 320 of the first section 314. Like the receiver die 34 described above, the receiver die 334 includes two contact strips 336 disposed on the front or top surface thereof, the contact strips 336 extending in spaced, generally parallel relation to each other along respective ones of an opposed pair of side edges of the receiver die 334.

The second section 316 of the leadframe 312 in the module 300 includes a four-sided frame portion 368 defining opposed pairs of spaced, generally parallel sides. Extending from one side of the frame portion 368 is a generally quadrangular connector portion 328 of the second section 316, the connector portion 328 being identically configured to the connector portion 322 of the first section 314. In contrast to the first section 314 wherein the die pad portion 320 and connector portion 322 extend along respective ones of two different planes as described above, the frame and connector portions 368, 328 of the second section 316 each extend along a common plane, and are of substantially uniform thicknesses.

In the module 300, the generally planar bottom surfaces of an opposed pair of sides of the frame portion 368 are electrically connected to respective ones of the contact strips 336 of the receiver die 334 through the use of respective layers or strips 358 of a conductive bonding material. Thus, the strips 358 effectively place the receiver die 334 into electrical communication with the second section 316 of the leadframe 312. Thus, the module 300 is devoid of any conductive wires. As seen in FIG. 16, in the fully assembled module 300, the thicknesses of the receiver die 334 and second section 316 are preferably such that the co-planar top surfaces of the frame and connector portions 368, 328 of the second section 316 extend in generally co-planar relation to the generally planar top surface of the connector portion 322 of the first section 314. Additionally, as is seen in FIG. 15, the first and second sections 314, 316 of the leadframe 312 are oriented such that the connector portions 322, 328 extend in side-by-side relation to each other. Though not shown in FIGS. 15 and 16, it is contemplated that the connector portions 322, 328, which define cabling flanges, may also optionally include apertures therein for the screw fastening of electrical wires.

As is further seen in FIG. 16, it is contemplated that the die pad portion 320 of the first section 314 of the leadframe 312 may be partially etched so as to define a shoulder or shelf 332 which extends along three of the four sides thereof. In this regard, the shelf 332 does not extend along that side surface of the die pad portion 320 to which the flange portion 318 is integrally connected. The shelf 332 is perpendicularly recessed relative to the bottom surface of the die pad portion 320, and extends in opposed relation to the top surface thereof. The use of the shelf 332 will be described in more detail below in relation to a variant of the module 300.

Referring now to FIGS. 17 and 18, there is shown a CPV module 300a which comprises a variant of the above-described CPV module 300. Only the distinctions between the modules 300, 300a are described below. The primary distinction between the modules 300, 300a lies in the leadframe 312 in the module 300a having an encapsulant material applied thereto which, upon hardening, forms a molded body 344 on the leadframe 312. As seen in FIG. 17, the molded body 344 has a generally quadrangular, frame-like configuration. The body 344 is formed such that it extends about and covers the peripheral side surfaces of the die pad portion 320 of the first section 314. The body 344 also covers a peripheral portion of the top surface of the die pad portion 320. However, as seen in FIG. 18, the bottom surface of the die pad portion 320 is exposed in and substantially flush with the generally planar bottom surface defined by the body 344. In addition, the body 344 covers the entirety of the flange portion 318 of the first section 314, and a portion of the generally planar bottom surface of the connector portion 322 thereof. However, the majority of the connector portion 322 protrudes from a side surface of the body 344. The shelf 332 is also covered by the body 344, thus creating a firm mechanical interlock between the body 344 and the die pad portion 320 (and hence the first section 314 of the leadframe 312). The body 344 also covers the entirety of the frame portion 368 of the second section 316 of the leadframe 312, and a portion of the connector portion 328 thereof. However, the majority of the connector portion 328 protrudes from the same side surface of the body 344 from which the connector portion 322 protrudes. Importantly, as is also seen in FIG. 17, the fully formed body 344 defines a window 346 in which a portion of the front or top surface of the receiver die 334 is exposed. Advantageously, the body 344 creates an alignment feature which may be used to properly align a light concentrating device such as a light guide or optical rod with the exposed surface of the receiver die 334.

Figure 19:
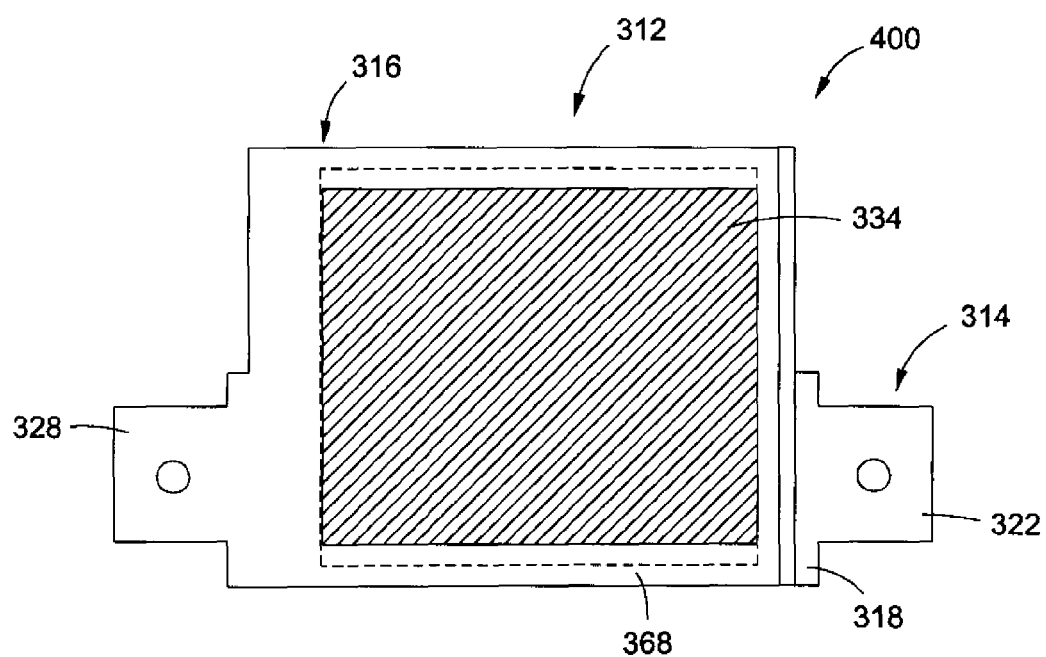
FIG. 19 is a top plan view of a CPV module constructed in accordance with a fifth embodiment of the present invention.

Referring now to FIG. 19, there is shown a CPV module 400 constructed in accordance with a fourth embodiment of the present invention. The module 400 is substantially similar to the above-described module 300, with only the distinctions between the modules 300, 400 being described below.

The sole distinction between the modules 300, 400 lies in the second section 316 of the leadframe 312 included in the module 400 being rotated approximately 180° relative to the orientation thereof in the module 300, as depicted in FIG. 15. Thus, in the module 400, the connector portions 322, 328 do not extend in side-by-side relation to each other. Rather, the connector portions 322, 328 are disposed in opposed relation to each other, i.e., extend in opposite directions. Additionally, in the module 400 shown in FIG. 19, the connector portions 322, 328 are each depicted as including one of the above-described apertures for the screw fastening of electrical wires. Though not shown in FIG. 19, it is contemplated that the leadframe 312 of the module 400 may be partially encapsulated with the above described body 344.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A CPV module, comprising:
a leadframe including a first section and a second section disposed in spaced relation to each other, the first section including a connector portion and a die pad portion that is attached to the connector portion and defines opposed top and bottom surfaces, the second section including a base portion, a connector portion extending from the base portion, and at least two prong portions extending from the base portion in spaced, generally parallel relation to each other, wherein the connector portions of the first and second sections of the leadframe extend in generally co-planar relation to each other along a common first plane, and the die pad portion of the first section extend along a second plane that is disposed in spaced, generally parallel relation to the first plane; and
a receiver die mounted and electrically connected to the first section, and electrically connected to each of the prong portions of the second section by respective ones of at least first and second electrical connectors.

2. The CPV module of claim 1 wherein the first and second electrical connectors each comprise a plurality of conductive wires.

3. The CPV module of claim 2 further comprising a molded body which covers the conductive wires, a portion of the receiver die, and portions of the first and second sections of the leadframe, the body defining a window in which a portion of the receiver die is exposed.

4. The CPV module of claim 3 wherein the window is defined by a surface of the body which is mechanically adapted to facilitate the alignment of a light concentrating device with the portion of the receiver die exposed in the window.

5. The CPV module of claim 3 wherein the receiver die is mounted and electrically connected to the top surface of the die pad portion, with the bottom surface of the die pad portion being exposed in the body.

6. The CPV module of claim 5 wherein the die pad portion includes a recessed shelf extending at least partially thereabout and covered by the body to form a mechanical interlock between the first section of the leadframe and the body.

7. The CPV module of claim 1 wherein a surface of each of the at least two prong portions is attached to the upper surface of the receiver die with a strip of a conductive bonding material.

8. The CPV module of claim 1, further comprising a molded body that partially covers the leadframe such that the bottom surface of the die pad portion of the first section is exposed in the molded body and the first and second connector portions protrude from the body, the molded body defining a window in which a portion of the receiver die is exposed.

9. The CPV module of claim 1, further comprising a light concentrating device cooperatively engaged with the receiver die.

10. The CPV module of claim 1 wherein the at least two prong portions of the second section extend in spaced, generally parallel relation to the die pad portion of the first section, the connector portion of the first section extends generally perpendicularly relative to the die pad portion thereof, and the connector portion of the second section extends generally perpendicularly relative to the prong portions thereof and in spaced generally parallel relation to the connector portion of the first section.

11. The CPV module of claim 1 wherein the second section of the leadframe further comprises a raised edge which extends along the base and prong portions thereof.

12. The CPV module of claim 11 wherein the second section of the leadframe further includes a cross member portion which extends between and interconnects the prong portions thereof, the raised edge further extending along the cross member portion.

13. A CPV module, comprising:
a leadframe including:
a first section defining a die pad portion having opposed top and bottom surfaces and a connector portion attached to the die pad portion; and
a second section disposed in spaced relation to the first section, the second section including a base portion, a connector portion attached to the base portion, and a pair of prong portions attached to and extending from the base portion in spaced, generally parallel relation to each other;
a receiver die mounted and electrically connected to the die pad portion of the first section, and electrically connected to the prong portions of the second section; and
a molded body which covers a portion of the receiver die, and portions of the first and second sections of the leadframe such that at least the bottom surface of the die pad portion of the first section, the connector portions of the first and second sections, and a portion of the receiver die are exposed in the body.

14. The CPV module of claim 13, wherein the pair of prong portions is attached to an upper surface of the receiver die with conductive bonding material.

15. The CPV module of claim 13, wherein the receiver die is electrically connected to the prong portions of the second section with a plurality of conductive wires.

16. A CPV module, comprising:
a leadframe including:
a first section defining a die pad portion having opposed top and bottom surfaces and a connector portion attached to the die pad portion; and
a second section disposed in spaced relation to the first section, the second section including a base portion, a connector portion attached to the base portion, and a pair of prong portions attached to and extending from the base portion in spaced relation to each other; and
a receiver die having a first major surface and an opposed second major surface, the second major surface mounted and electrically connected to the die pad portion of the first section, wherein surfaces of the prong portions are attached and electrically connected to the first major surface of the receiver die with a conductive bonding material.

17. The CPV module of claim 16 further comprising a molded body that covers a portion of the receiver die, and portions of the first and second sections of the leadframe such that at least a portion of the bottom surface of the die pad portion of the first section, the connector portions of the first and second sections, and a portion of the receiver die are exposed in the molded body.

18. The CPV module of claim 17, wherein the molded body defines a window in which the portion of the receiver die is exposed, and wherein the window is defined by a surface of the molded body that is mechanically adapted to facilitate the alignment of a light concentrating device with the portion of the receiver die exposed in the window.

19. A CPV module, comprising:
a leadframe including a first section and a second section disposed in spaced relation to each other, the first section including a first connector portion and a die pad portion that is attached to the first connector portion and defines opposed top and bottom surfaces, the second section including a frame portion and a second connector portion extending from the frame portion, the frame portion comprising at least two prong portions;
a receiver die mounted and electrically connected to the top surface of the die pad portion, the at least two prong portions attached and electrically connected to the receiver die; and
a molded body that partially covers the leadframe such that the bottom surface of the die pad portion of the first section is exposed in the molded body and the first connector portion and the second connector portion protrude from the body, the molded body defining a window in which a portion of the receiver die is exposed.

20. The CPV module of claim 19, wherein the first and second connector portions of the leadframe extend in side-by-side relation to each other.

* * * * *